United States Patent [19]

Lueder

[11] 4,293,831
[45] Oct. 6, 1981

[54] MONOLITHICALLY INTEGRATED CHARGE TRANSFER CIRCUIT

[75] Inventor: Rainer Lueder, Oberhaching, Fed. Rep. of Germany

[73] Assignee: Siemens Aktiengesellschaft, Berlin & Munich, Fed. Rep. of Germany

[21] Appl. No.: 124,128

[22] Filed: Feb. 25, 1980

[30] Foreign Application Priority Data

Mar. 30, 1979 [DE] Fed. Rep. of Germany ....... 2912745

[51] Int. Cl.³ .................. H03H 17/06; G11C 19/28; G11C 27/02
[52] U.S. Cl. .................. 333/165; 307/221 D; 333/166; 333/173
[58] Field of Search .............. 333/165, 166, 18 R, 333/173; 357/24; 307/221 D, 221 C, 295, 303, 304, 233, 241, 242; 328/167, 165; 364/724–726, 824–827, 862

[56] References Cited

U.S. PATENT DOCUMENTS

| | | | |
|---|---|---|---|
| 3,889,245 | 6/1975 | Gosney, Jr. | 357/24 X |
| 4,145,676 | 3/1979 | Benoit-Gonin et al. | 307/221 D X |
| 4,204,177 | 5/1980 | Eggermont | 333/173 X |

*Primary Examiner*—Marvin L. Nussbaum
*Attorney, Agent, or Firm*—Hill, Van Santen, Steadman, Chiara & Simpson

[57] ABSTRACT

A plurality of MIS charge transfer systems are connected to the output of a first MIS charge transfer system and are operated in parallel with each other. The plurality of charge transfer systems form filters of the same kind, or of a different kind, and charge packets emitted thereby have different delay times and are subsequently converted into a voltage which is sampled at a higher frequency than the sampling frequency for the signal which is applied to the input of the first MIS charge transfer system. This voltage is smoothed by a simple low pass filter.

4 Claims, 10 Drawing Figures

$$H(z) = (1-K)\left(1 + \frac{K}{1-K} z^{-1}\right)$$

RELATIVE SURFACES
a = 0.1867
b = 0.1285
c = 0.0653
d = 0.239

TRANSMISSION FUNCTION OF A
CCD LOW PASS WITH INTERPOLATING
OUTPUT LEVEL.
$f_A = 24$ kHz
$f_{A'} = 96$ kHz

MONOLITHICALLY INTEGRATED CHARGE TRANSFER CIRCUIT

BACKGROUND OF THE INVENTION

1. Field of the Invention

The present invention relates to a monolithically integrated charge transfer circuit having a signal scanner, a first clock pulse controlled metal-insulator-semiconductor (MIS) charge transfer system which is supplied with charge packets via the signal scanner and a clock pulse controlled output stage which is connected to the MIS charge transfer system and which serves for the restoration of a signal which is constant in time.

2. Description of the Prior Art

Such monolithically integrated charge transfer circuits are, for example, described in "Der Elektroniker", No. 3/1978, pp. EL7-EL15, whereas the essentials concerning MIS charge transfer systems having clock pulse control may be found in "Der Elektroniker", No. 2/1978, pp. EL3-EL6. The embodiment of such an output stage for MIS charge transfer systems is to be represented in the following for charge coupled circuits (CCD circuits), and nevertheless it is applicable in the same manner to bucket brigade device circuits (BBD circuits).

In the case of the transmission of signals by means scanning systems, the scanning brings about a periodicity of the frequency spectrum of the scanned signal, which must be done away with in the case of a conversion into signals which are constant in time by means of suitable filters, since the higher spectral components interfere in the case of multiples of the scanning frequency for many cases of application. This means that one must solve the problem of regaining a band-limited signal from the output signal of a charge transfer circuit, which output signal is formed by the scanning values, whereby the higher spectral components which arose by means of scanning are adequately attenuated. For the interpolation of the scanning values, as a rule, a scan holding element and a subsequently connected analog low pass filter are provided. In many cases, a RC filter is insufficient for the low pass filter which is to be used, so that one must use LC filters. However, with such structure, one loses the possibility of integrating the filter monolithically upon a common semiconductor chip with the remaining parts of a charge transfer circuit. A completely integratable solution of the problem is nevertheless of great significance for CCD circuits which, for example, form filters or time delays.

There are two possibilities for reducing the selection requirements placed upon a low pass filter: (1) increasing the scanning frequency $f_A$ of the CCD; or (2) post-connecting a further CCD low pass filter which functions with the scanning frequency $f'_A$ to the first CCD, whereby the scanning frequency $f'_A$ of the low pass filter is larger than the scanning frequency $f_A$ of the first CCD. Then the following analog low pass filter can be designed very simply, or perhaps can be completely omitted.

However, a higher scanning frequency of a CCD installation [case (1)] in the case of the same system requirements, increases proportionally the number N of the charge transport elements and, therefore, increases the surface requirement for the semiconductor chip and, as a rule, leads to poorer system characteristics by means of raised charge transport losses ($\epsilon N$). Also, the expense of a following CCD low pass filter of higher scanning frequency $f'_A$ is relatively high, conditioned by the clock pulse generation.

SUMMARY OF THE INVENTION

It is therefore the object of the present invention to provide a monolithically integrated charge transfer circuit without raising the scanning frequency $f_A$ and without a CCD low pass filter which operates with an increased scanning frequency, and, on the other hand, which permits the use of a simple analog low pass filter and, therefore, permits the complete integratability of the circuit without requiring this advantage at a sacrifice in the quality of reproduction.

According to the present invention, the above object is achieved in that at least two MIS charge transfer systems are coupled in parallel to the output of a charge transfer system, that the charge packets which are transferred to the output of the first charge transfer system having different weight are supplied to the parallel charge transfer systems of the output stage, of which there are at least two. In addition, for controlling the MIS charge transfer system, the same transfer clock pulses are provided and, in addition, the MIS charge transfer systems in each case represent a filter. Further, these filters, in total, display filter characteristics which are different from one another and display different time delays and all of the MIS charge transfer systems are placed on a common charge output stage which functions with a whole number multiple of the scanning frequency of the first charge transfer system. In addition, a simple low pass filter follows the charge output stage for smoothing the remaining higher spectral components.

The method which forms the basis for the device which is proposed herein executes an interpolation of the scanning values of the CCD output signal in an extended CCD output circuit. The effect is that of a CCD low pass filter having a higher clock pulse frequency, so that the interpolating output stage releases scanning values having an increased scanning rate.

The first charge transfer system which the interpolating output stage follows is to be a m-phase CCD having a scanning frequency $f_A$ (with, for example, $m=3$ or 4). At the input of the output stage, the charge packet of the m-phase CCD is split up weighted and is supplied to m different CCD circuits, which in each case possesses filter characteristics according to the principle of the weighted charge splitting and the different time delays of the charges in these branches. After these filters, the charges are delayed differently, whereby these delays amount to a multiple of $1/mf_A$ in the case of the m-phase CCD. The charges, in each case, displaced by $1/mf_A$, proceed into the customary diffusion region. The voltage which arises is scanned by means of a scan holding member having the frequency $mf_A$. Since in the case of m-phase CCD's, the clock pulse phases $\phi_1 \ldots \phi_n$ are advantageously derived from the frequency $mf_A$ by means of division, the additional expense for the clock pulse generation being low. Also, a delay in each case by the amount $i/mf_A$ (where $i=1, 2 \ldots m$) is easily possible by means of the use of i electrodes.

BRIEF DESCRIPTION OF THE DRAWINGS

Other objects, features and advantages of the invention, its organization, construction and operation will be best understood from the following description, taken in conjunction with the accompanying drawings, on which.

DESCRIPTION OF THE PREFERRED EMBODIMENTS

Figure 1:
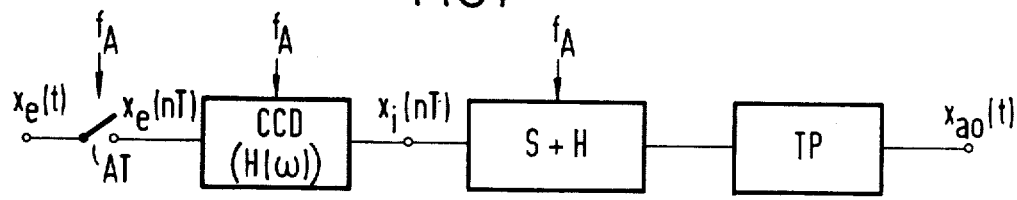
FIG. 1 is a schematic block diagram of a scanning system.

Referring to FIG. 1, if a signal $x_e(t)$ is transmitted by means of a CCD and if a clock pulse frequency $f_A$ is employed, then the output signal $x_i$ comprises scanning values $x_i(nT)$, where $T=f_A^{-1}$. The spectrum $X_i(\omega)$ is periodic with the scanning frequency $f_A$. In order to recover a band-limited signal $x_a(t)$ which is constant in time, the scanning values are generally supplied to a scanning-holding circuit, which attenuates higher spectral components of $X_i(\omega)$ by means of the transmission function $H_{SH}(\omega)$, whereby $$H_{SH}(\omega) = \sin(\omega T/2)/(\omega T/2).$$

As a rule, also a low pass filter must be connected to the output in order to attain a sufficient attenuation of the spectrum $X_{ao}(\omega)$ for frequencies f, which are larger than $f_A/2$.

In this manner, the scheme of a scanning system which is represented in FIG. 1 results, comprising a scanner, a CCD connected to the scanner, a following sample and hold circuit S+H, and a low pass filter TP.

Figure 2:
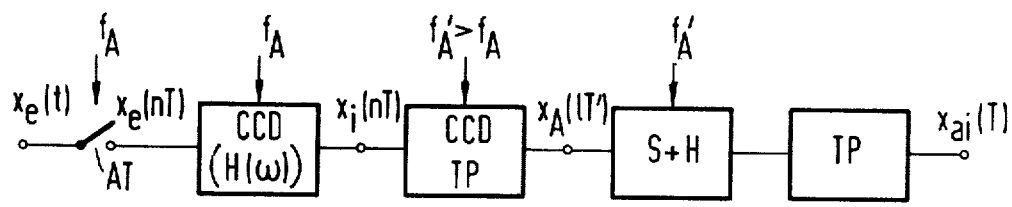
FIG. 2 is a schematic block diagram of a system similar to that of FIG. 1 with a CCD interposed between an initial CCD and a sample and hold circuit.

The high attenuation of the higher spectral frequencies of $X_i(\omega)$, which is generally required in the case of the use of CCD circuits cannot be attained automatically in the case of the customary design as an integrated circuit. There exists only the possibility which was already indicated of allowing a CCD low pass filter, which functions at a higher scanning frequency $f'_A f_A$ and which delivers interpolated scanning values $x_A$ (1T'), where $T'=f_A'^{-1}$ from the scanning values $x_i$ (nT) to follow the first CCD with the transmission function H ($\omega$), so that one arrives at the design which can be seen from FIG. 2. Then, the low pass filter TP which is connected to the output of the sampling and holding circuit S+H can be designed as a simple low pass filter, therefore, only with resistances and capacitances. However, the high expense which was indicated above arises for the generation of the clock pulse frequency $f'_A$.

The invention provides a method which unites the characteristics of a CCD low pass filter of the scanning frequency $f_A'$ mentioned above, in an output circuit of the first CCD circuit. This principle will be described with reference to FIGS. 3 and 4.

Figure 5:
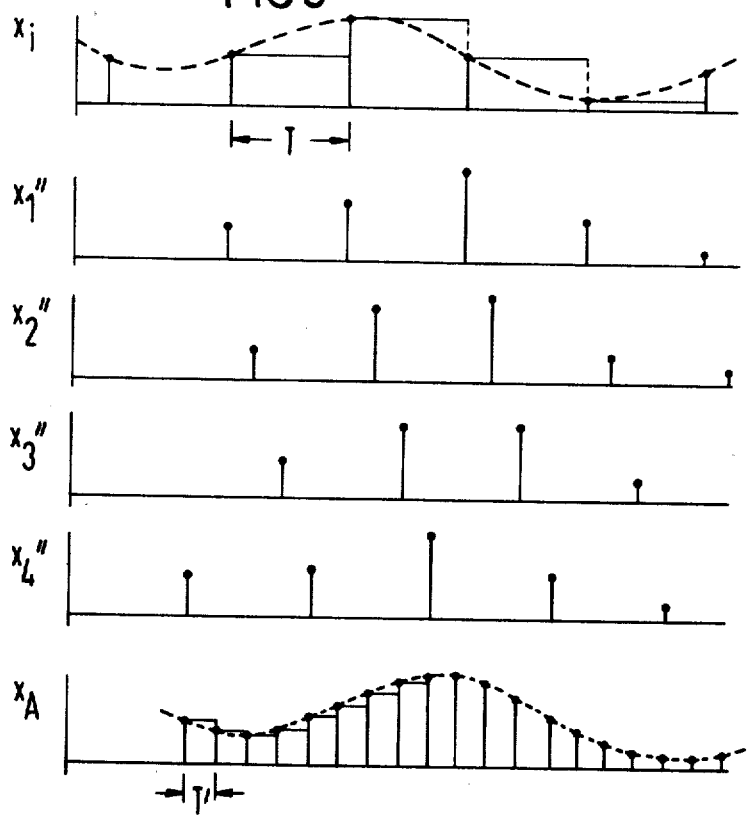
FIG. 5 is a graphic illustration of the signals for m parallel filters, where m=4.

The scanning values $x_i(nT)$ are supplied to the m parallel filters $H_j(z)$, where j=1, 2 ... m. The output signals $x_j(nT)$ of each filter are delayed by a time interval (j-1) T', where T'=T/m. The sum of these delayed scanning values $x_j''$ produces the output signal $X_A$(1T'), which now displays a higher scanning rate $f_A'$. FIG. 5 illustrates these signals for an example where m=4.

Figure 3:
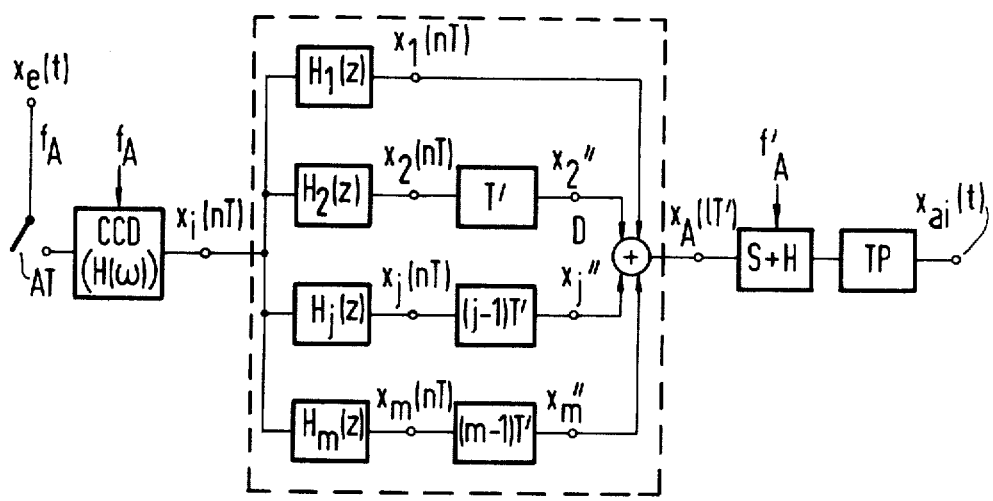
FIG. 3 illustrates a CCD low pass filter which may be utilized in the circuit of FIG. 2.
Figure 4:
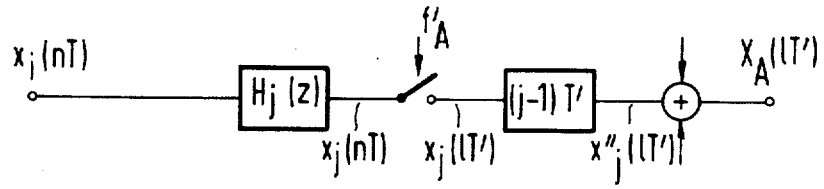
FIG. 4 is a mathematical model illustrating the derivation of a transmission function for FIG. 3.

The derivation of the transmission function $H_A$ of the output stage is made easier if one represents the signals $x_j$ (nT) as scanning values $x_j'(1T')$ of the scanning frequency $f_A'$, that is, that one uses a mathematical model according to FIG. 4, which is equivalent to that of FIG. 3. This leads to the relationships $$x_j'(1T') = x_j(nT) \tag{1a}$$

with $l = m \cdot n$ and $n = 0, 1, 2, \ldots$ and $$x_j'(1T') = 0, \tag{1b}$$

with $l \neq m \cdot n$ whereby $T' = T/m$.

Therefore, the following relationship applies for the Z transformations of the signal $x_j$, or respectively, $x_j'$ $$X_j'(z') = X_j(z'^m) = X_j(z), \tag{2}$$

with $z = e^{j\omega T}$ and $z' = e^{j\omega T'}$.

Therefore, one obtains the representation for $X_A(Z')$, to wit $$X_A(z') = \sum_j X_j''(z') = \tag{3}$$

$$\sum_j X_j'(z') z'^{-(j-1)} =$$

$$\left[ \sum_j H(z'^m) \cdot z'^{-j+1} \right] X_i(z').$$

The transmission function of the output stage is, therefore, $$H_A(z') = H_j(z'^m) z'^{-j+1}. \tag{4}$$

If the transmission function $H_A(z')$ is formed by a non-recurrent filter, the function of which is expressed as $$H_A(z') = \sum_i a_i z'^i \tag{5}$$

then one obtains for the filter $H_j(z'^m) = H_j(z)$, the following representation $$H_j(z'^m) = a_{(j-1)} + a_{(m+j-1)} z'^{-m} + a_{(zm+j-1)} z'^{zm} + \tag{6a}$$

$$H_j(z) = a_{j-1} + a_{m+j-1} z^{-1} + a_{am+j-1} z^{-2} + \tag{6b}$$

Therefore, according to equation (5), one can prescribe a transmission function $H_A(z')$ of the interpolating output stage which is preferably that of the low pass filter of the scanning frequency $f_A' = mf_A$. From this, according to equation (6b), the transmission functions of the m filter $H_j(z)$ can be provided, which can be realized as a CCD filter having the scanning frequency $f_A$.

With respect to a practical embodiment, it is first to be determined that one in many cases can select the non-recurrent transmission function $H_A(z')$ such that the coefficients $a_i$ are exclusively positive according to equation (5). Then, the filters $H_j(z'^m)$ can be realized by means of branching circuits.

Figure 6:
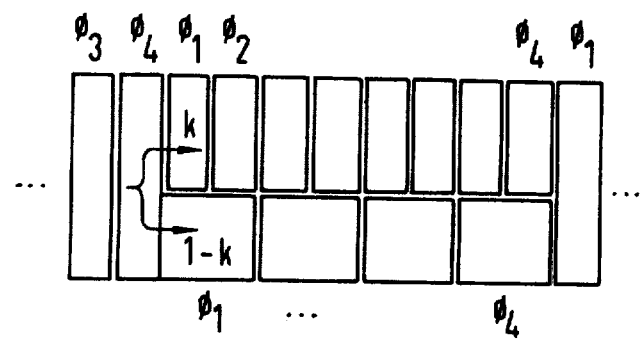
FIG. 6 is a schematic representation of a plan view of a CCD branching filter.

The electrode pattern of an exemplary CCD branching filter is represented in FIG. 6, and has a transmission function which is expressed as $$H(z) = (1-k) \cdot \left(1 + \frac{kz^{-1}}{(1-k)}\right).$$

The quantity k is that portion of the charge quantity which is displaced from the left to the right which is crossing over at the branching location of the CCD filter onto the one parallel branch and the quantity $(1-k)$ is that portion which is crossing over onto the other parallel branch. The factor k or, respectively, $(1-k)$, is equal to the ratio of the surface of a divided electrode to the sum of the surface of all divided parallel disposed electrodes.

Figure 7:
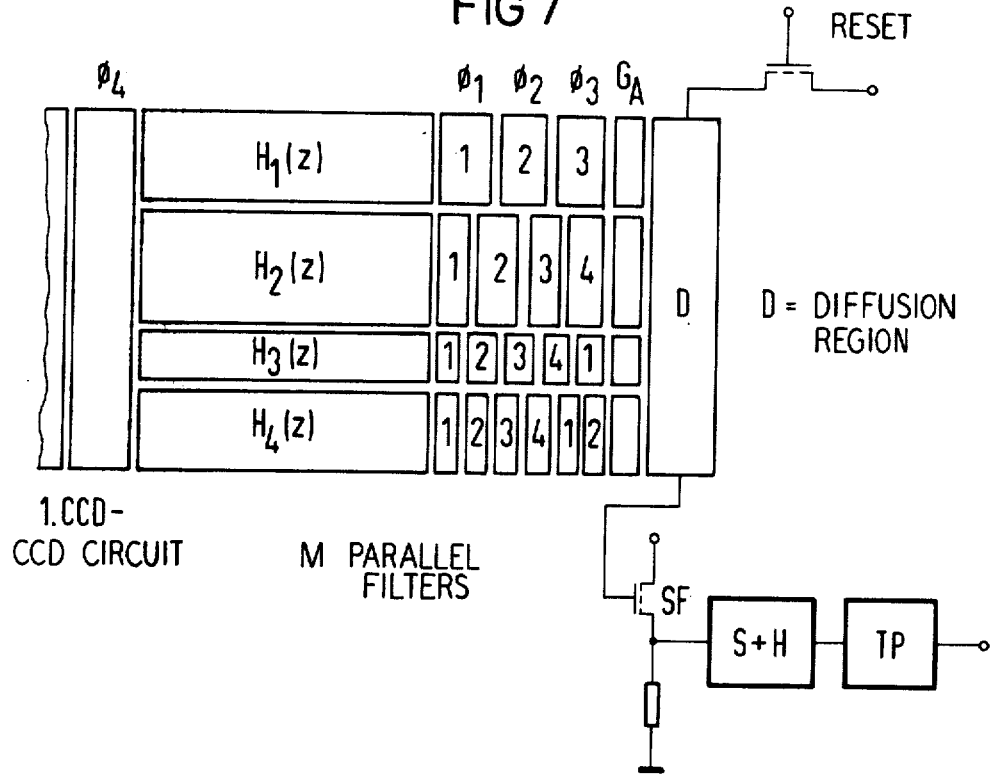
FIG. 7 is a schematic illustration of a plan view of an embodiment of a CCD constructed in accordance with the present invention.

The output signal $x_i$ of the CCD circuit is a charge $q_i(nT)$, which, in the case of a m-phase CCD, is fed to the CCD branch filters $H_j(z)$ by means of weighted splitting off in m branches. The output signals $q_j(nT)$ are delayed by an interval $(j-1)T'$ by means of $(j-1)$ electrodes of the m-phase CCD. The charges, in each case displaced by the time interval T', arrive in a diffusion region D, the potential of which customarily released by means of a source-follower as an output signal $u_A(t)$. In this manner, one arrives at the embodiment of the device constructed in accordance with the invention as illustrated in FIG. 7. The diffusion region D, the potential of which is generally released as an output signal by means of a source-follwer SF, as already noted above, is reset to a defined potential with a frequency $f_A' = T'^{-1}$. The signal $u_A(t)$ is scanned with a frequency $f_A'$ by means of a sample and hold circuit S+H which is designed in a conventional manner and which can be favorably realized in MOS technology and which has connected thereto a simple low pass filter (for example, an RC circuit with $f_g \approx f_A/2$) for providing an analog output signal $x_{ao}(t)$.

Since the m clock pulse signals of an m-phase CCD can be derived from the frequency $f_A' = mf_A$, no large additional expense arises for generating the reset clock pulse and the scanning or sampling clock pulse.

Figure 9:
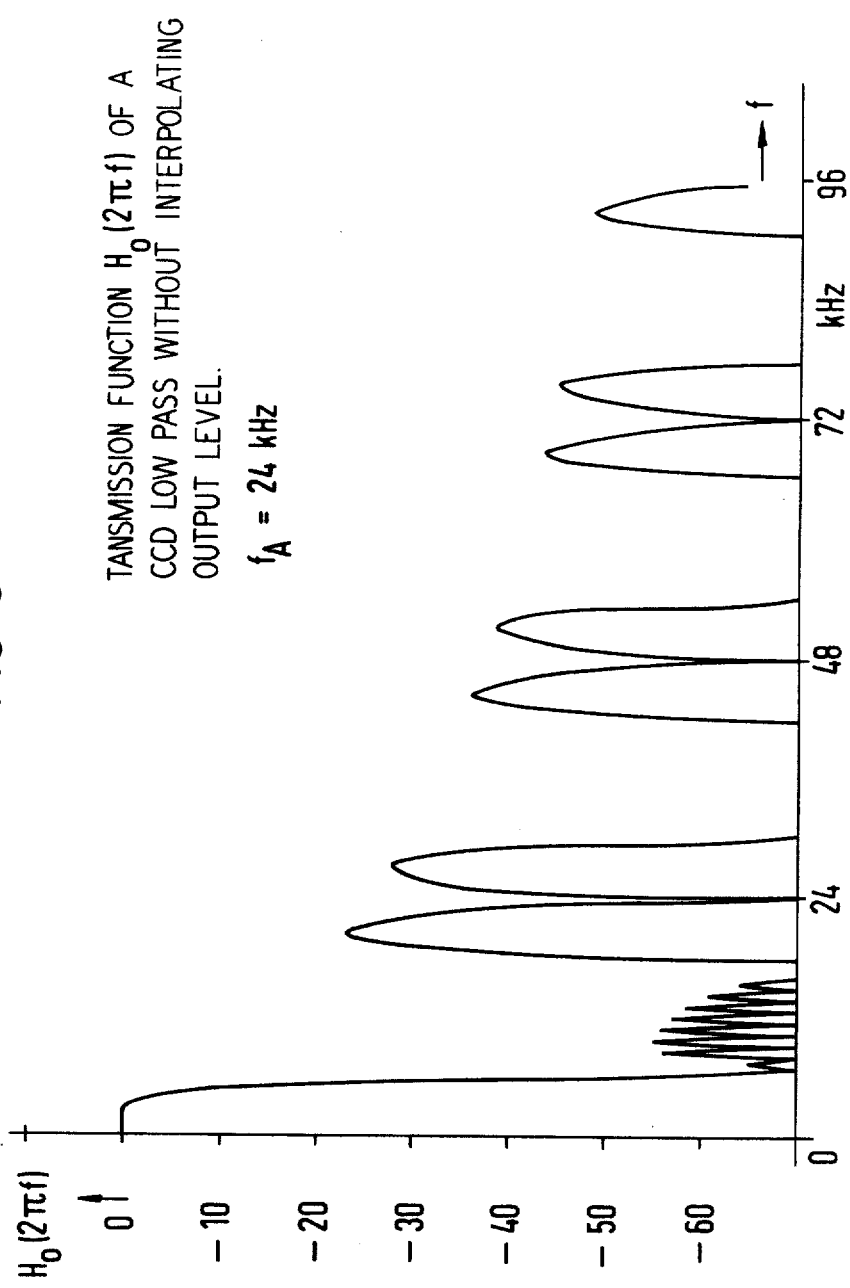
FIG. 9 is a graphic illustration of a transmission function in which the output signal has noticeable spectral components.

The exemplary embodiment now to be discussed concerns a four-phase CCD low pass filter with a frequency $f_{3dB} = 4$ kHz, which is dimensioned for a clock pulse frequency $f_A = 24$ kHz, and which has a sample and hold circuit S+H and a post-connected RC low pass filter TP with $f_g = 10$ kHz. The resulting transmission function $H_o(2\pi f)$ shows that the output signal $x_{ao}(t)$ possesses noticeable spectral components at $f_A$, $2f_A$..., as can be seen from FIG. 9.

An interpolating CCD output stage according to the present invention has for this CCD filter the following advantageous transmission function $H_A(z') = 0.0653 + 0.1285z'^{-1}$
$+ 0.1867z'^{-2} + 0.239z'^{-3} + 0.1867z'^{-4}$
$+ 0.1285z'^{-5} + 0.0653z'^{-6}$ This low pass function can be determined with known synthesis methods of digital filters and can be optimized for specific applications.

Figure 8:
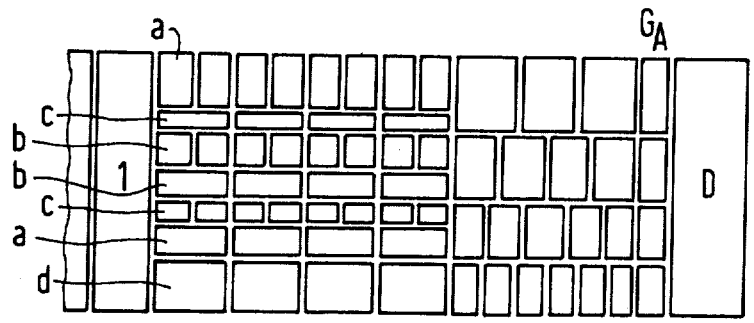
FIG. 8 is a schematic representation of another embodiment constructed in accordance with the present invention.

From this, for the filter $H_j(z)$, one obtains the expressions $H_1(z) = 0.0653 + 0.1867z^{-1}$ $H_2(z) = 0.1285 + 0.1285z^{-1}$ $H_3(z) = 0.1867 + 0.0653z^{-1}$ $H_4(z) = 0.239.$ FIG. 8 illustrates a structure for the interpolating CCD output stage. The coefficients are determined by means of the surface relationships noted on FIG. 8.

Figure 10:
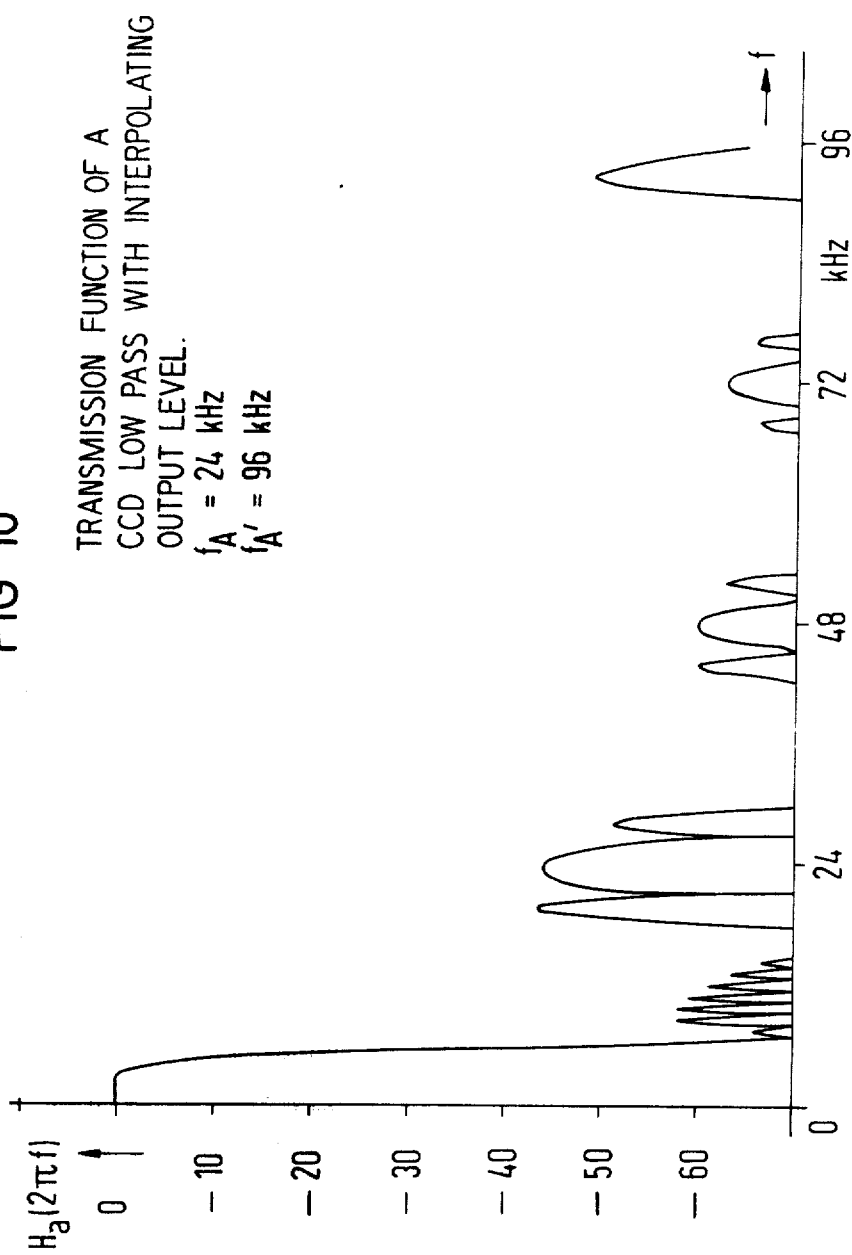
FIG. 10 is a graphic illustration of a transmission function of a CCD low pass filter having an interpolating output stage.

The total transmission function of the CCD low pass filter having an interpolating output stage, a sample and hold circuit and an RC low pass filter ($f_g = 10$ kHz) is illustrated in FIG. 10.

With respect to a post-connected CCD low pass filter of higher clock pulse frequency, the invention leads to a significantly lower surface requirement in the case of monolithic integration, it requires no further input and output converter, it needs only a simple clock pulse generation, and, in addition, it is suitable for higher clock pulse frequencies because no amplifier is necessary and because in such a case the charge transport proceeds with the frequency $f_A$ instead of the frequency $f_A'$.

In contrast to customary (LC or RC active) low pass filters, by means of the interpolating CCD output stage, the requirement on the edge steepness of the post-connected low pass filter can be reduced by a factor of 10–20 at m=4, and an integratable RC circuit which is tolerance-insensitive suffices for the low pass filter TP, as a general rule.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a monolithically-integrated charge transfer device with a singal scanner, a first clock-controlled metalinsulator-semiconductor charge transfer and which is supplied with charge packets by the signal scanner, and which has a clock-controlled output stage connected to the first charge transfer system, the improvement therein comprising:

at least two additional metal-insulator-semiconductor clock-controlled charge transfer systems each including an input connected in common to the first charge transfer system and an output connected in common with each other so as to be in parallel;

each of said parallel charge transfer systems forming a filter and each constructed to have a respective different delay time;

sampling means connected to said common outputs for sampling the same at a frequency that is higher than that of the scanner; and a low pass filter connected to said sampling means for smoothing the output of the sampling means.

2. The improved charge transfer device of claim 1, and further defined as comprising:
   an output circuit including a common diffusion region for the outputs of said parallel charge transfer systems, said common diffusion region connected to be reset into an initial condition with the higher sampling frequency.

3. The improved charge transfer device of claim 2, and further defined as comprising:
   a source-follower circuit connected between said common diffusion region and said sampling means.

4. The improved charge transfer device of claim 3, and further defined as:
   each of said parallel charge-transfer systems includes weighting means.

* * * * *